United States Patent
Zhu et al.

(10) Patent No.: US 11,294,512 B2
(45) Date of Patent: Apr. 5, 2022

(54) CAPACITIVE TOUCH SENSOR

(71) Applicant: TEXAS INSTRUMENTS INCORPORATED, Dallas, TX (US)

(72) Inventors: Ling Zhu, Shanghai (CN); Xutong Han, Shenzhen (CN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 16/855,435

(22) Filed: Apr. 22, 2020

(65) Prior Publication Data

US 2021/0173500 A1 Jun. 10, 2021

Related U.S. Application Data

(63) Continuation of application No. PCT/CN2019/123581, filed on Dec. 6, 2019.

(51) Int. Cl.
*G06F 3/044* (2006.01)
*H03K 17/96* (2006.01)

(52) U.S. Cl.
CPC ........... *G06F 3/044* (2013.01); *H03K 17/962* (2013.01); *H03K 2217/9607* (2013.01)

(58) Field of Classification Search
CPC .............................. G06F 3/044; H03K 17/962
USPC ................... 345/173, 178; 382/183
See application file for complete search history.

(56) References Cited

U.S. PATENT DOCUMENTS

| 8,149,564 | B2 | 4/2012 | Liu et al. | |
|---|---|---|---|---|
| 9,735,339 | B2* | 8/2017 | Lonnberg | G06F 3/03547 |
| 2006/0258139 | A1* | 11/2006 | Iijima | H05K 3/4647 |
| | | | | 438/612 |
| 2010/0109971 | A2* | 5/2010 | Gummalla | H01Q 5/335 |
| | | | | 343/909 |

(Continued)

FOREIGN PATENT DOCUMENTS

| CN | 104798154 A | 7/2015 |
|---|---|---|
| CN | 106775100 A | 5/2017 |

(Continued)

OTHER PUBLICATIONS

International Search Report for PCT/CN2019/123581 dated Aug. 27, 2020.

*Primary Examiner* — Prabodh M Dharia
(74) *Attorney, Agent, or Firm* — Brian D. Graham; Charles A. Brill; Frank D. Cimino

(57) ABSTRACT

An apparatus comprises a circuit board having a first conductive pad on a circuit board surface and a conductive overlay, which has a first surface and a second surface opposite the first surface and is configured to deflect in response to a touch on the first surface. A protrusion protrudes from the second surface and is configured to be a second conductive pad. The circuit board, the conductive overlay, and the protrusion are arranged such that the second surface faces the circuit board surface and is separated from the first conductive pad by a first distance. The protrusion and the first conductive pad are separated by a second distance and have an overlapping area. The apparatus may also comprise a spacer configured to separate the first conductive pad from the second surface by the first distance and from the protrusion by the second distance.

22 Claims, 7 Drawing Sheets

(56) References Cited

U.S. PATENT DOCUMENTS

| | | | |
|---|---|---|---|
| 2010/0244871 A1* | 9/2010 | Blair | H05K 1/112 |
| | | | 324/756.05 |
| 2012/0134532 A1* | 5/2012 | Ni | G06K 9/00785 |
| | | | 382/103 |
| 2014/0211366 A1 | 7/2014 | Morris, III et al. | |
| 2017/0154734 A1 | 1/2017 | Morris, III et al. | |
| 2018/0039351 A1* | 2/2018 | Zhu | G06F 3/0447 |
| 2019/0362899 A1 | 11/2019 | Morris, III et al. | |

FOREIGN PATENT DOCUMENTS

| | | | | |
|---|---|---|---|---|
| CN | 106775100 B | * | 5/2017 | G06F 3/0414 |
| CN | 106775100 B | * | 5/2017 | G06F 3/0414 |
| CN | 206894615 U | | 1/2018 | |
| CN | 108281286 A | | 7/2018 | |
| EP | 2898519 | | 7/2015 | |
| WO | 2014047525 | | 3/2014 | |

\* cited by examiner

CAPACITIVE TOUCH SENSOR

CROSS-REFERENCE TO RELATED APPLICATIONS

This application is a continuation of International Application No. PCT/CN2019/123581, filed Dec. 6, 2019, which is incorporated by reference herein in its entirety.

BACKGROUND

Touch sensors continue to replace mechanical devices such as buttons and switches as user inputs into electronic devices as varied as household appliances, vehicles, and point of sale terminals, Capacitive touch sensors are often used, some of which are formed of two plates with an overlapping area and separated by a distance. A touch deflects one of the plates, changing the distance between the two plates and, by extension, the capacitance between the two plates. The sensitivity of the capacitive touch sensor depends on the thickness of the touched plate, that is, how much the touch deflects it, and the distance between the two plates.

A thinner plate corresponds to increased sensitivity but poor structural strength, such that the sensor may permanently deform and become unusable. In a touch-based interface with multiple capacitive touch sensors in close proximity, a touch on a thinner plate may cause portions of the plate over more than one touch sensor to deflect, causing the interface to falsely identify touches at additional touch sensors. A thicker plate corresponds to better structural strength but decreased sensitivity, such that a touch on the thicker plate may not deflect the plate and change the capacitance enough to identify the touch.

SUMMARY

An apparatus comprises a circuit board having a first conductive pad on a circuit board surface and a conductive overlay, which has a first overlay surface and a second overlay surface opposite the first overlay surface. The conductive overlay is configured to deflect in response to a touch on the first overlay surface, and a protrusion protrudes from the second overlay surface. The protrusion is configured to be a second conductive pad. The circuit board, the conductive overlay, and the protrusion are arranged such that the second overlay surface faces the circuit board surface and is separated from the first conductive pad by a first distance. The protrusion and the first conductive pad are separated by a second distance and have an overlapping area.

In some examples, the surface of the protrusion is substantially flat and parallel to the first conductive pad. The protrusion is cylindrical such that the surface of the protrusion is circular in some examples, and prismatic such that the surface of the protrusion is rectangular in other examples. The overlapping area between the first conductive pad and the protrusion comprises less than an area of the first conductive pad in some examples. In some implementations, the conductive overlay has a first thickness chosen such that the conductive overlay deflects in response to a touch on the first overlay surface, and the protrusion has a second thickness chosen to be a different between the first and the second distances. The conductive overlay comprises a touch portion in some examples, and deflects in response to a touch on the first overlay surface at the touch portion. The protrusion protrudes from the second overlay surface at a position corresponding to the touch portion.

In some implementations, a spacer protrudes from the second overlay surface at a position outside of the touch portion, and has a third thickness chosen such that the spacer reduces deflection of the conductive overlay at the position outside of the touch portion in response to a touch on the first overlay surface at the touch portion. The spacer touches the circuit board surface in some examples, and the third thickness is further chosen such that the spacer separates the first conductive pad from the second overlay surface by the first distance and from the protrusion by the second distance. In some implementations, the spacer is a first spacer, and the circuit board has a second spacer on the circuit board surface that touches the first spacer. The second spacer has a fourth thickness chosen such that the first and second spacers separate the first conductive pad from the second overlay surface by the first distance and from the protrusion by the second distance.

BRIEF DESCRIPTION OF THE DRAWINGS

For a detailed description of various examples, reference will now be made to the accompanying drawings in which.

DETAILED DESCRIPTION

The disclosed touch sensors balance touch sensitivity and durability by including a protrusion on the conductive overlay, such that the conductive overlay is separated from the conductive sensor pad on the circuit board by a greater distance than the protrusion is. The smaller distance between the conductive sensor pad on the circuit board and the protrusion increases the touch sensitivity while the conductive overlay is separated from the conductive sensor pad by larger or more rigid spacers to increase durability. The conductive overlay may be supported by a spacer on the circuit board, comprise a second spacer that touches the spacer on the circuit board, or comprise a spacer that touches the circuit board itself.

Figure 1:
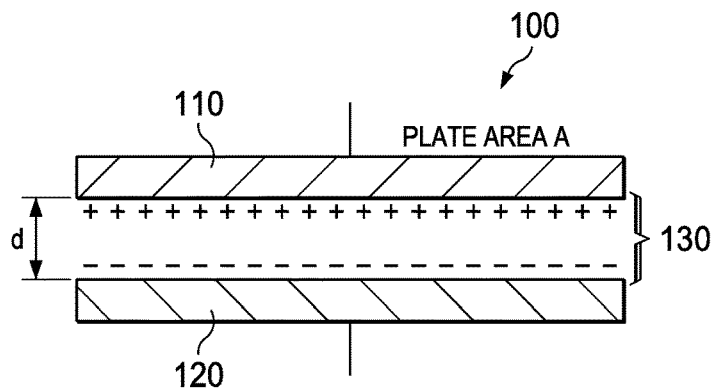
FIG. 1 shows a capacitor having two plates.

FIG. 1 illustrates a cross-sectional view of a plate capacitor 100, which has an upper plate 110 and a lower plate 120 spaced apart from the upper plate 110 by a distance d. The upper plate 110 and the lower plate 120 can be metal conductive plates, and have an overlapping surface area A. In the example of FIG. 1, an air dielectric 130 separates the upper plate 110 and the lower plate 120, although in other embodiments other dielectric materials are used. The capacitance C of capacitor 100 may be represented as:

$$C = (\varepsilon r)(\varepsilon 0)\frac{A}{d}$$

where εr represents the relative permittivity of the dielectric 130 between the upper plate 110 and the lower plate 120 and ε0 represents the permittivity of free space. The capacitance C is inversely proportional to the distance d between the upper plate 110 and the lower plate 120. A change in distance Δd changes the capacitance. Some capacitive touch sensors use a change in distance Δd and the corresponding change in the capacitance C to detect a touch.

Figure 2A:
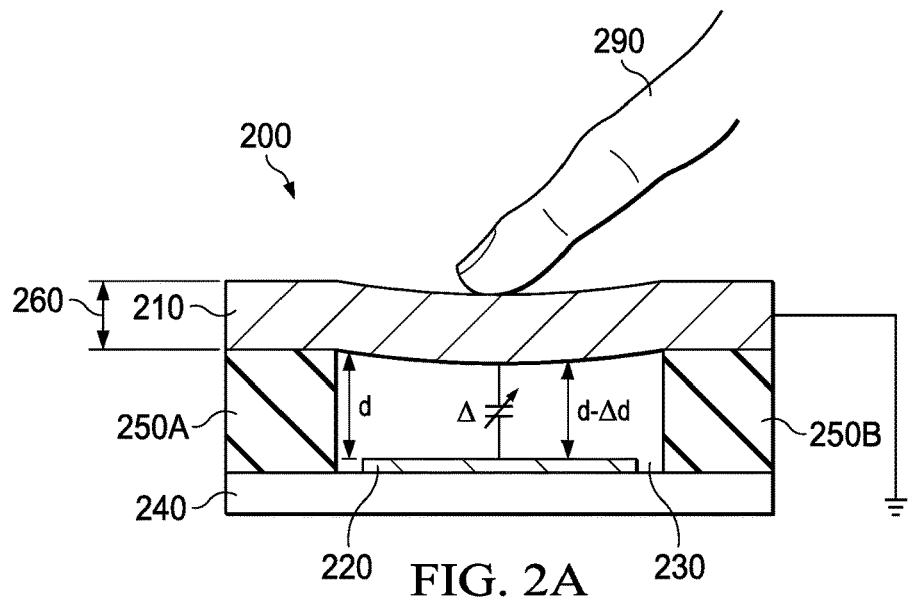
FIGS. 2A-B show a diagram of a touch sensor detecting a deflection in a touch sensor using capacitive sensing, and an equivalent circuit diagram, respectively.
Figure 2B:
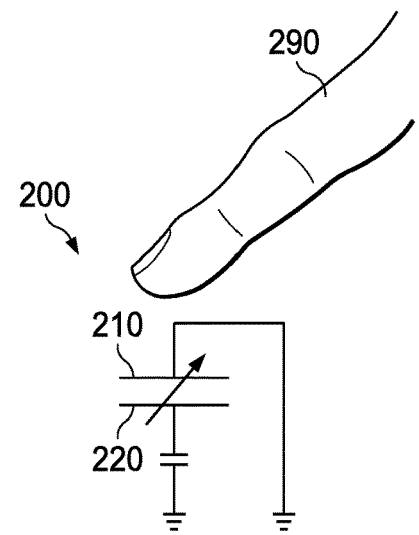

FIGS. 2A-B show a touch sensor 200 and a corresponding equivalent circuit. In FIG. 2A, touch sensor 200 includes a conductive plate 210, a sensor pad 220 on a circuit board 240, and spacers 250A-B on either side of sensor pad 220 and separating the conductive plate 210 at a predetermined distance d from sensor pad 220. Conductive plate 210 and sensor pad 220 form the upper and lower plates of a capacitor. Conductive plate 210 has an outer planar surface for receiving a touch and an inner planar surface on an opposite side. Sensor pad 220 may be made of copper, such as a copper foil or a patterned copper electroplated layer. In one example, the area of sensor 220 is larger than a fingertip, approximately 100 millimeters square. The distance between spacer 250A and spacer 250B on either side of sensor pad 220 may be larger than the area of sensor 220, which may enable a larger deflection in conductive plate 210.

Conductive plate 210 has a thickness 260 chosen to allow deflection due to a human touch. As shown in FIG. 2A, conductive plate 210 deflects in response to the pressure from a human finger 290 applied to conductive plate 210. The deflection causes a change in capacitance proportional to the change in distance Δd. As shown in FIG. 2B, the capacitance of the capacitor formed by conductive plate 210 and sensor pad 220 is variable in response to a touch on the outer planar surface of conductive plate 210. By applying a voltage to sensor pad 220, a system can determine the capacitance of the capacitor formed by conductive plate 210 and sensor pad 220. By repeatedly scanning a plurality of sensors, the system can detect changes in capacitance and detect a touch on conductive plate 210 based on the changes in capacitance.

The sensitivity of the capacitance of the touch sensor 200 to force depends on the thickness 260 of conductive plate 210, the height of spacers 250A-B, and the resulting distance d. The thickness 260 of conductive plate 210 also influences the durability of touch sensor 200, for example a too-thin conductive plate will deform permanently, rather than deflect. Similarly, in a system with multiple touch sensors in close proximity, a too-thin conductive plate and insufficiently rigid spacers can cause a touch on one sensor to also deflect the conductive plate over other sensors, causing them to falsely identify a touch.

Figure 3A:
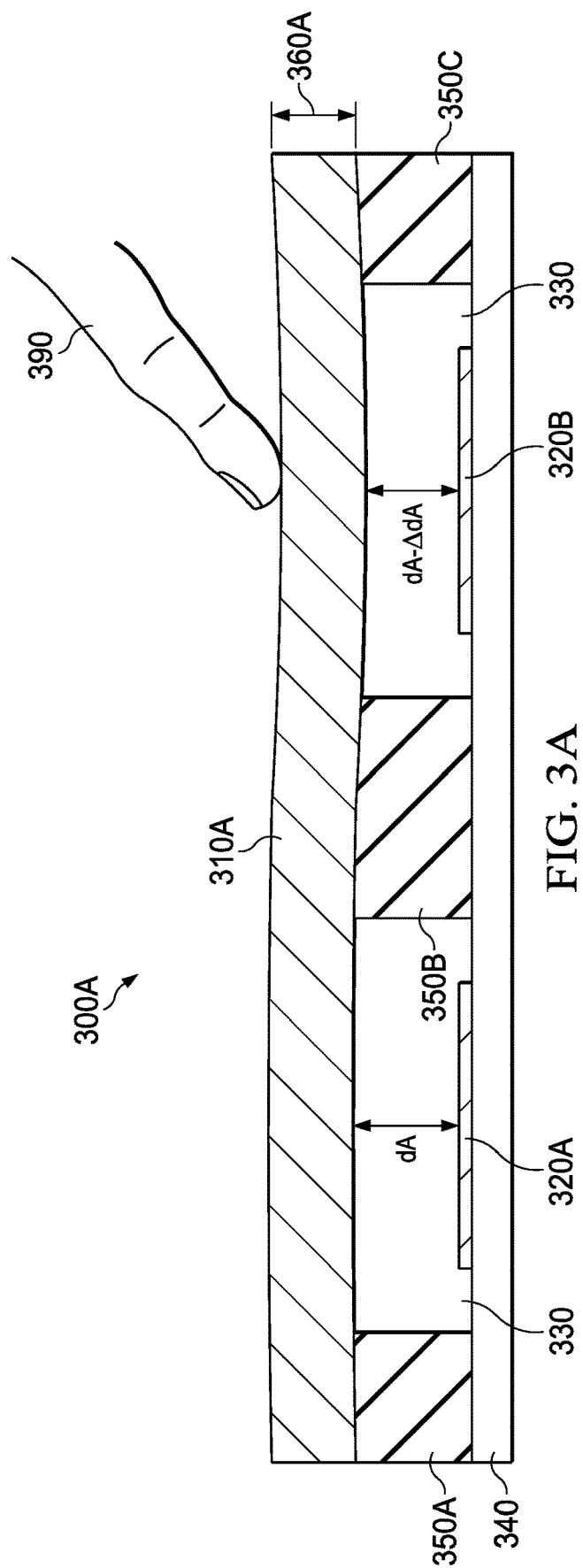
FIGS. 3A-C illustrate variations of the touch sensor shown in FIG. 2A.
Figure 3B:
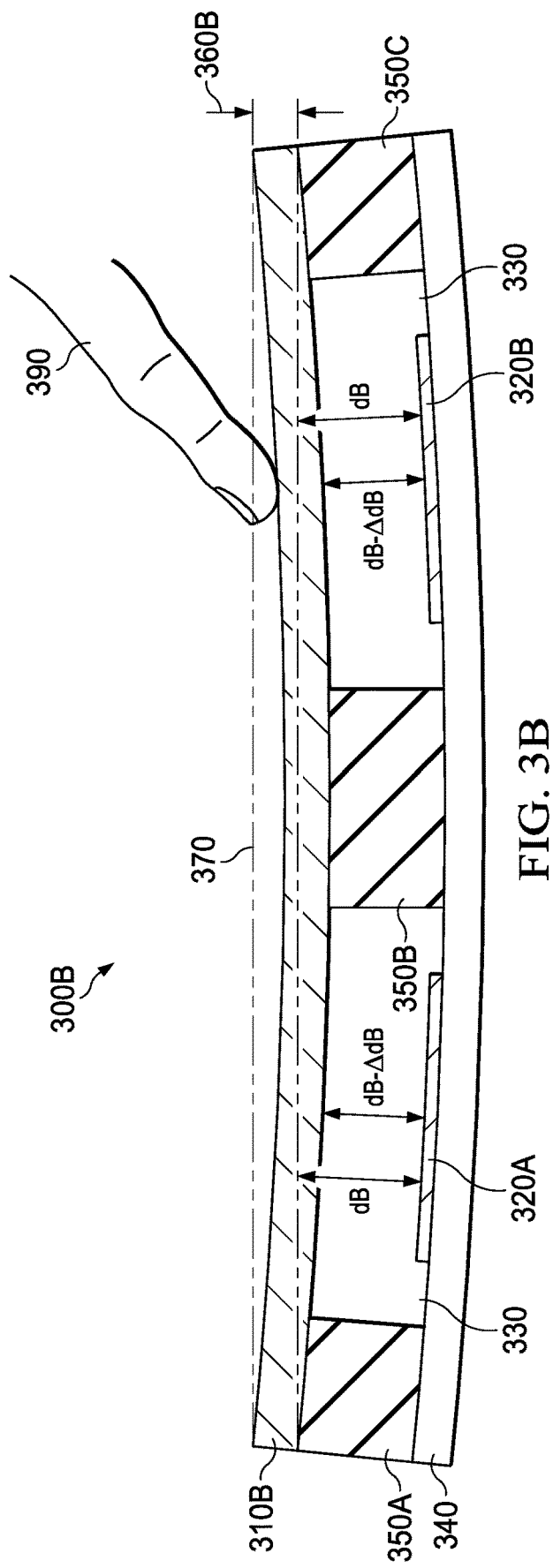
Figure 3C:
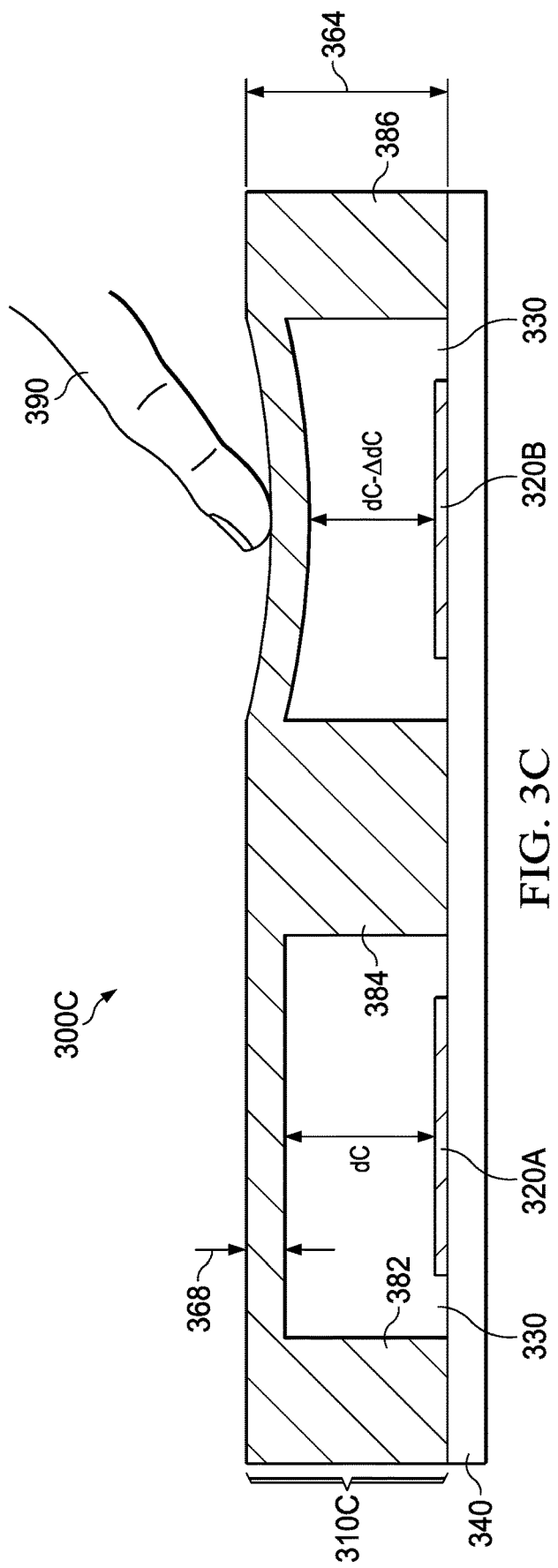

FIGS. 3A-C illustrate example touch sensor systems 300A-C with multiple touch sensors, which are similar to touch sensor 200 shown in FIG. 2A. In FIG. 3A, touch sensor system 300A includes a conductive plate or overlay 310A with a thickness 360A, spacers 350A-C, and sensor pads 320A-B on a circuit board 340. Spacers 350A-C separate conductive plate 310A from sensor pads 320A-B by a distance dA, which is filled by dielectric 330. Sensor pad 320A forms a first capacitor with conductive plate 310A, which functions as a first touch sensor. Sensor pad 320B forms a second capacitor with conductive plate 310A, which functions as a second touch sensor. Spacer 350B between sensor pads 320A-B attempts to maintain the distance dA such that a deflection in conductive overlay 310A over sensor pad 320A does not also cause a deflection in conductive overlay 310A over sensor pad 320B, or vice versa, which would cause one of the touch sensors to falsely identify a touch.

The thickness 360A of conductive plate 310A is greater than the thickness 260 of conductive plate 210, such that conductive plate 310A does not deflect as much as conductive plate 210 in response to a touch by human finger 390. The thickness 360A of conductive overlay 310A causes the change in distance ΔdA from a touch by human finger 390 to be quite small, such that the corresponding change in capacitance may be less than a threshold change in capacitance indicative of a touch. Thus, the larger thickness 360A of conductive overlay 310A reduces the sensitivity of touch sensor system 300A.

In FIG. 3B, touch sensor system 300B is substantially the same as touch sensor system 300A but includes a conductive plate 310B with a thickness 360B separated from sensor pads 320A-B by a distance dB. The thickness 360B of conductive plate 310B is less than the thickness 260 of conductive plate 210 and the thickness 360A of conductive plate 310A, such that conductive plate 310B deflects more than conductive plate 210 or conductive plate 310A in response to a touch by human finger 390. The thickness 360B of conductive overlay 310B causes the change in distance ΔdB from a touch by human finger 390 to be quite large, such that touch sensor system 300B is more sensitive than touch sensor system 300A.

However, the smaller thickness 360B of conductive overlay 310B corresponds to a weaker structure than the larger thickness 360A of conductive plate 310A, such that a touch on conductive overlay 310B may cause touch sensor system 300B to deform. Spacer 350B may be insufficient to maintain the distance dB, such that a deflection in conductive plate 310B over sensor pad 320B also causes a deflection in conductive plate 310B over sensor pad 320A. The deflection over sensor pad 320A causes the first touch sensor to falsely identify a touch. The smaller thickness 360B may also cause conductive plate 310B to remain deformed compared to its prior position 370 after the touch is removed. The deformed conductive plate 310B may remain separated from sensor pads 320A-B by a distance dB-ΔdB that is less than the distance dB associated with its prior position 370.

In FIG. 3C, touch sensor system 300C is similar to touch sensor systems 300A-B but includes a conductive overlay 310C with varying thicknesses separated from sensor pads 320A-B by a distance dC that is greater than the distances dA or dB and omits spacers 350A-C. Conductive overlay 310C comprises its own spacers 382, 384, and 386 with a first thickness 364. The first thickness 364 is chosen to separate sensor pads 320A-B and the portions of conductive plate 310C that are not spacers 382, 384, and 386 by the distance dC. Spacers 382, 384, and 386 on conductive plate 310C are taller and more rigid than spacers 350A-C to prevent conductive overlay 310C from deforming the way conductive plate 310B does and falsely identifying touches on other nearby sensor pads.

The portions of conductive plate 310C that are not spacers 382, 384, and 386 have a second thickness 368 which is less than the first thickness 364 and chosen to allow deflection due to a touch by human finger 390. The deflection causes a change in distance ΔdC, which may be substantially the same as the change in distance Δd for a deflection in conductive plate 210. Although the change in distance Δd compared to the distance d causes a sufficient change in capacitance to identify a touch, the substantially same change in distance ΔdC compared to the larger distance dC causes an insufficient change in capacitance to identify a touch. Thus, the first thickness 364 of conductive plate 310C for the spacers 382, 384, and 386 results in a stronger and more durable touch sensor system 300C but also decreases the sensitivity of touch sensor system 300C, such that the human finger 390 must apply more pressure and deflect conductive overlay 310C more in order to change the capacitance enough to be identified as a touch.

Figure 4A:
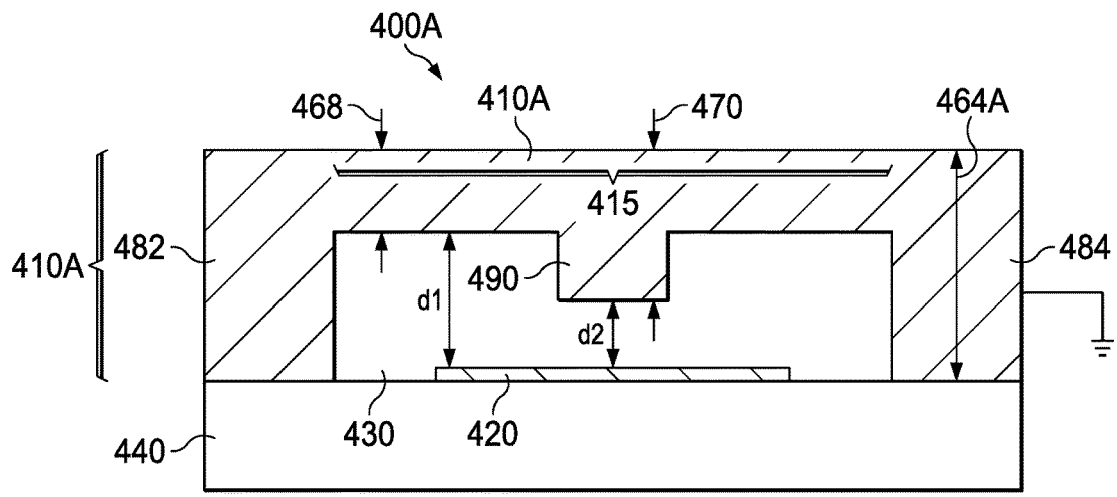
FIGS. 4A-C illustrate variations of a touch sensor including a conductive overlay with a protrusion.
Figure 4B:
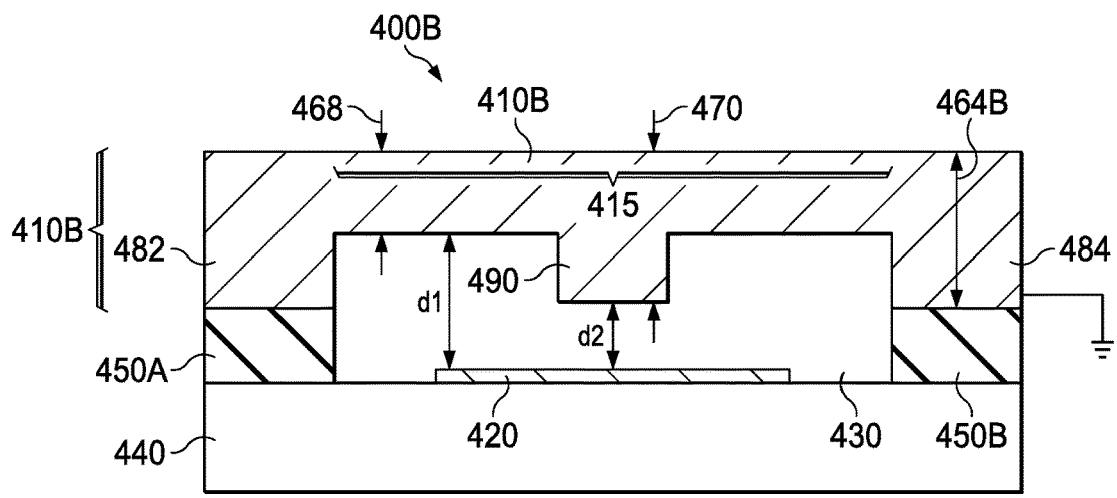
Figure 4C:
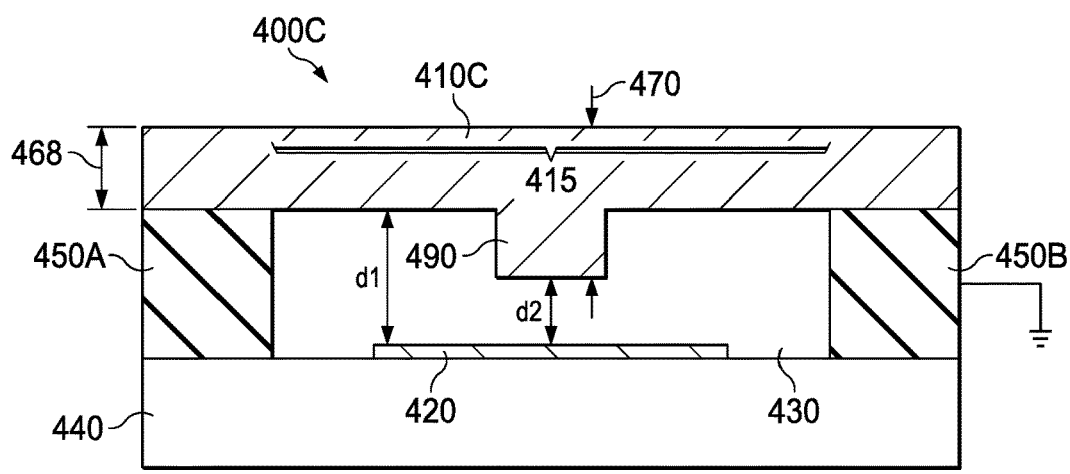

FIGS. 4A-C illustrate example touch sensor systems 400A-C. In FIG. 4A, touch sensor system 400A includes a conductive plate or overlay 410A with a protrusion 490 over a sensor pad 420 on a circuit board 440. Conductive plate 410A has varying thicknesses and is separated from sensor pad 420 by a dielectric 430. Conductive plate 410A has a first planar surface which can be touched at a touch portion 415, indicated by the bracket, and a set of interior opposing planar surfaces that face sensor pad 420 and circuit board 440. The set of interior surfaces include a first interior surface that extends from a spacer in a direction substantially coplanar with the top of the sensor pad 420 when the conductive overlay 410A is untouched, a second interior surface that extends vertically from the first interior surface towards the sensor pad 420, a third interior surface that extends from the second interior surface in a direction substantially coplanar with the first interior surface when the conductive overlay 410A is untouched to define a protrusion 490, a fourth interior surface that extends vertically from the third interior surface away from the sensor pad 420, and a fifth interior surface that extends substantially coplanar with the first interior surface when the conductive overlay 410A is untouched. The first interior surface and the fifth interior surface may meet outside of the illustrated cross sectional plane. The varying thickness of conductive overlay 410A allows touch sensor system 400A to achieve the durability and touch isolation while avoiding the corresponding decrease in sensitivity illustrated in touch sensor system 300C.

The conductive overlay 410A may have uniform or varying composition in the protrusion 490 and the remainder of the conductive overlay 410. In that regard, the conductive overlay 410A may include any suitable conductive materials including metals, conductive polymers, metal impregnated polymers, and combinations thereof that allow the conductive overlay 410A to deflect in response to a touch. In particular, portions of conductive overlay 410A having a first thickness 468 deflect in response to a touch on the first planar surface of conductive overlay 410A and are separated from sensor pad 420 by a first distance d1. Portions of conductive overlay 410A having a second thickness 464A act as spacers 482 and 484 and ensure the portions of conductive overlay 410A having the first thickness 468 are separated from sensor pad 420 by the first distance d1 in the absence of a touch. Portions of conductive overlay 410A having a third thickness 470, that is, protrusion 490, are separated from sensor pad 420 by a second distance d2 that is smaller than the first distance d1. Spacers 482 and 484 of conductive plate 410A with the second thickness 464A give conductive overlay 410A the stronger structure associated with conductive plate 310C shown in FIG. 3C. Protrusion 490 enables touch sensor system 400A to identify a touch from a change in distance Δd that is larger relative to the total distance (e.g., distance d2 compared to the larger distance d1) thereby increasing the sensitivity of touch sensor system 400A compared to touch sensor system 300C.

In FIG. 4B, touch sensor system 400B is similar to touch sensor system 400A, but includes spacers 450A-B and conductive plate 410B. Like conductive plate 410A, portions of conductive plate 410B have the first thickness 468, deflect in response to a touch on the first planar surface of conductive plate 410B at the touch portion 415, indicated by the bracket, and are separated from sensor pad 420 by the first distance d1. Like conductive plate 410A, protrusion 490 on conductive plate 410B has the third thickness 470 and is separated from sensor pad 420 by the second distance d2.

Unlike conductive plate 410A though, the portions of conductive plate 410B acting as spacers 482 and 484 have a different, fourth thickness 464B which is less than the second thickness 464A and greater than the first thickness 468. Spacers 482 and 484 of conductive plate 410B with the fourth thickness 464B rest on top of spacers 450A-B, respectively, the combination of which ensures the portions of conductive overlay 410B having the first thickness 468 are separated from sensor pad 420 by the first distance d1. The combination of spacers 450A-B and spacers 482 and 484 of conductive overlay 410B achieve substantially the same durability, touch isolation, and sensitivity as touch sensor system 400A.

The spacers 450A-B may be similar or different from the conductive overlay 410B in material and/or composition. In some examples where the material of spacers 450A-B is cheaper to use than the conductive material of plate 410B, the combination of spacers 450A-B and the shallower thickness 464B for spacers 482 and 484 of conductive overlay 410B may be chosen to reduce the cost of fabrication. In other embodiments, the combination is chosen to reduce the brittleness of touch sensor system 400B where the material of spacers 450A-B is less rigid than the material of plate 410B, allowing touch sensor system 400B to flex rather than snap under high pressure, but sufficiently rigid to maintain the system's durability and touch isolation.

In FIG. 4C, touch sensor system 400C is similar to touch sensor system 400B, but includes conductive plate 410C. Like conductive plate 410B, portions of conductive plate 410C have the first thickness 468, deflect in response to a touch on the first planar surface of conductive plate 410C at the touch portion 415, indicated by the bracket, and are separated from sensor pad 420 by the first distance d1. Like conductive plate 410B, protrusion 490 on conductive plate 410C has the third thickness 470 and is separated from sensor pad 420 by the second distance d2.

Unlike conductive plate 410B though, conductive plate 410C does not include portions acting as spacers, whether the second thickness 464A or the fourth thickness 464B. Spacers 450A-B alone ensure the portions of conductive overlay 410C having the first thickness 468 are separated from sensor pad 420 by the first distance d1. In some examples where the material of spacers 450A-B is cheaper to use than the conductive material of plate 410C, spacers 482 and 484 may be omitted to reduce the cost of fabrication. In other embodiments, the material of spacers 450A-B is sufficiently rigid to maintain the system's durability and touch isolation with the inclusion of spacers 482 and 484 on conductive overlay 410C.

Figure 5:
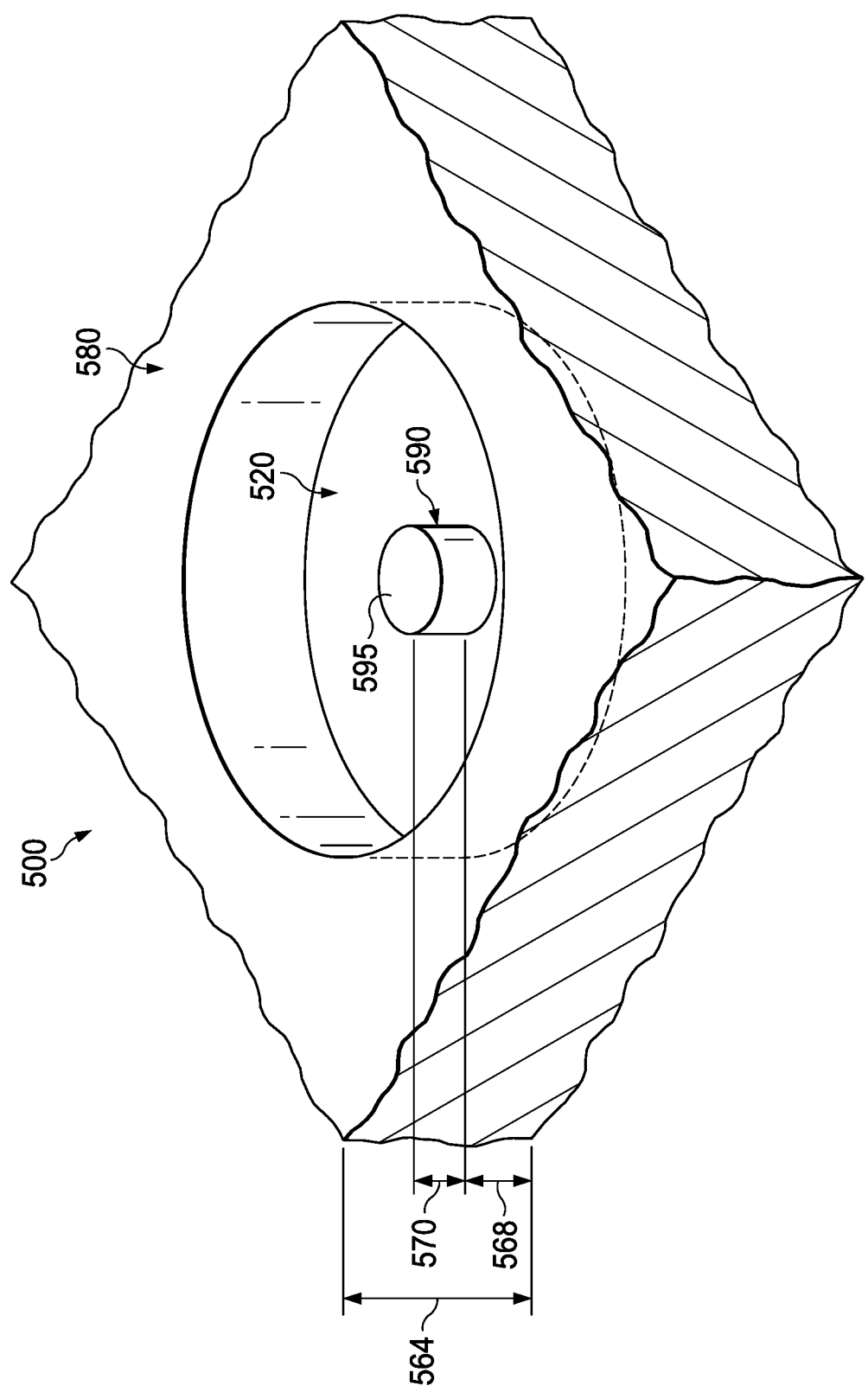
FIG. 5 illustrates a conductive overlay with a protrusion.

FIG. 5 illustrates the inner planar surface of a conductive plate or overlay 500 with a protrusion 590, which may be used as conductive plates 410A-C in touch sensor systems 400A-C. Conductive plate 500 has a first thickness 568 in area 520, which is configured to deflect in response to a touch. Conductive overlay 500 has a second thickness 564 in area 580, which acts as a spacer. Conductive overlay 500 has a third thickness 570 at protrusion 590. Although in this example protrusion 590 is shown substantially centered in area 520, in other implementations protrusion 590 is not centered in area 520. Surface 595 of protrusion 590 is configured to be placed facing the corresponding sensor pad such that surface 595 and the corresponding sensor pad have an overlapping area. The overlapping area can be less than the surface area of the corresponding sensor pad. In some implementations, the overlapping area is substantially centered over the corresponding sensor pad, while in other implementations the overlapping area is not centered over the corresponding sensor pad.

Surface 595 is separated from the corresponding sensor pad by a smaller distance than the area 520 is separated from it. Although protrusion 590 is shown as cylindrical and surface 595 is shown as having a circular shape, any appropriate shape may be used instead to obtain a desired shared surface area between surface 595 and the corresponding sensor pad as long as surface 595 is flat, rather than pointed or rounded. In some embodiments, protrusion 590 is prismatic, such that surface 595 is rectangular.

Figure 6:
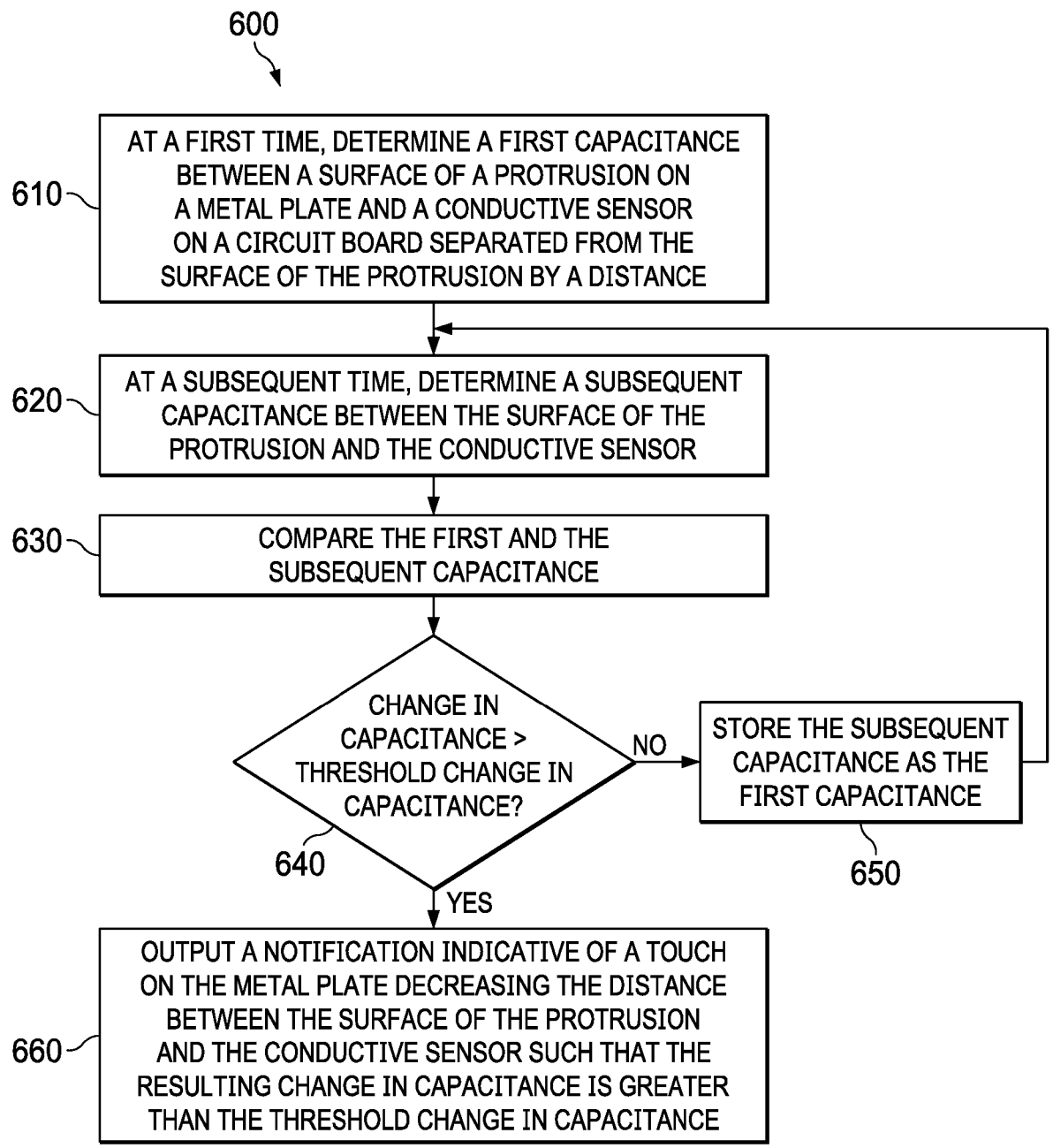
FIG. 6 illustrates an example process for detecting a touch on a touch sensor.

FIG. 6 illustrates an example process 600 for detecting a touch on a touch sensor such as touch sensor systems 400A-C. Process 600 is configured to be performed by one or more processing units able to read from and/or write to an appropriate non-transitory storage medium such as static random access memory (SRAM). The storage medium can be used to store instructions and data received from the one or more processing units. For step 610 and at a first time, the processing unit determines a first capacitance between a surface of a protrusion on a conductive plate and a conductive sensor on a circuit board separated from the surface of the protrusion by a distance. For example, the processing unit determines a first capacitance between the surface of protrusion 490 and sensor pad 420 in any of touch sensor systems 400A-C, which are separated by the distance d2.

For step 620 and at a subsequent time, the processing unit determines a subsequent capacitance between the surface of the protrusion and the conductive sensor. At step 630, the processing unit compares the first and the subsequent capacitances. If, at step 640, the processing unit determines a change in capacitance between the first and the subsequent capacitances is not greater than a threshold change in capacitance, the processing unit proceeds to step 650. The threshold change in capacitance can be chosen to represent a change in capacitance resulting from a touch on the conductive plate decreasing the distance between the surface of the protrusion and the conductive sensor. At step 650, the processing unit stores the subsequent capacitance as the first capacitance and proceeds to repeat steps 620-640.

If, at step 640, the processing unit determines the change in capacitance between the first and the subsequent capacitances is greater than the threshold change in capacitance, the processing unit outputs a notification indicative of a touch on the conductive plate with sufficient pressure to decrease the distance between the surface of the protrusion and the conductive sensor such that the resulting change in capacitance is greater than the threshold change in capacitance. That is, the processing unit outputs a notification indicative of a touch on the touch sensor.

The term "couple" is used throughout the specification. The term may cover connections, communications, or signal paths that enable a functional relationship consistent with the description of the present disclosure. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

What is claimed is:

1. An apparatus, comprising:
   a circuit board having a first conductive pad on a circuit board surface; and
   a conductive overlay having:
     a first overlay surface;
     a second overlay surface opposite the first overlay surface such that the conductive overlay has a first thickness between the first overlay surface and the second overlay surface; and
     a protrusion protruding from the second overlay surface and having a third overlay surface such that the conductive overlay has a second thickness between the first overlay surface and the third overlay surface that is greater than the first thickness;
   wherein the conductive overlay is configured to deflect in response to a touch on the first overlay surface; and
   wherein the circuit board, the conductive overlay, and the protrusion are arranged such that:
     the second overlay surface faces the circuit board surface,
     the second overlay surface and the first conductive pad are separated by a first distance, and
     the protrusion and the first conductive pad are separated by a second distance,
   the protrusion and the first conductive pad having an overlapping area.

2. The apparatus of claim 1, wherein:
   the first thickness of the conductive overlay is such that the conductive overlay is configured to deflect in response to the touch on the first overlay surface; and
   the second thickness of the conductive overlay is a difference between the first distance and the second distance.

3. The apparatus of claim 1, wherein the conductive overlay comprises a touch portion, wherein the conductive overlay is configured to deflect in response to the touch on the first overlay surface at the touch portion, and wherein the protrusion protrudes from the second overlay surface at a position corresponding to the touch portion.

4. The apparatus of claim 3, wherein the protrusion protrudes from the second overlay surface at a position substantially centered in the touch portion.

5. The apparatus of claim 3, further comprising a spacer protruding from the second overlay surface at a position outside of the touch portion.

6. The apparatus of claim 5, wherein the spacer has a third thickness such that the spacer reduces deflection of the conductive overlay at the position outside of the touch portion in response to a touch on the first overlay surface at the touch portion.

7. The apparatus of claim 6, wherein the spacer physically contacts the circuit board surface, wherein the third thickness causes the spacer to separate the second overlay surface and the first conductive pad by the first distance and separate the protrusion and the first conductive pad by the second distance.

8. The apparatus of claim 6, wherein the spacer comprises a first spacer, the circuit board further having a second spacer on the circuit board surface, the second spacer touching physically contacting the first spacer and having a fourth thickness such that the first and the second spacers separate the second overlay surface and the first conductive pad by the first distance and separate the protrusion and the first conductive pad by the second distance.

9. The apparatus of claim 3, the circuit board further having a spacer on the circuit board surface, the spacer physically contacting the second overlay surface at a position outside of the touch portion and having a fifth thickness such that the spacer separates the second overlay surface and the first conductive pad by the first distance and separates the protrusion and the first conductive pad by the second distance.

10. The apparatus of claim 1, wherein the third overlay surface of the protrusion is substantially flat and parallel to the first conductive pad.

11. The apparatus of claim 10, wherein the protrusion is cylindrical such that the third overlay surface of the protrusion is circular.

12. The apparatus of claim 10, wherein the protrusion is prismatic such that the third overlay surface of the protrusion is rectangular.

13. The apparatus of claim 1, wherein the overlapping area comprises less than an area of the first conductive pad.

14. An apparatus, comprising:
a circuit board having a first conductive sensor pad on a circuit board surface;
a conductive overlay having:
a first overlay surface;
a second overlay surface opposite the first overlay surface such that the conductive overlay has a first thickness between the first overlay surface and the second overlay surface;
a protrusion protruding from the second overlay surface and having a protrusion surface that is flat and parallel to the second overlay surface, the protrusion having a second thickness between the first overlay surface and the protrusion surface that is greater than the first thickness, wherein the protrusion is configured to act as a second conductive sensor pad; and
a touch portion that includes a portion of the second overlay surface and the protrusion, wherein the protrusion is substantially centered in the touch portion and wherein the touch portion is configured to deflect in response to a touch on the first overlay surface at the touch portion; and
a spacer protruding from the second overlay surface at a position outside of the touch portion and having a third thickness chosen such that the spacer is configured to reduce deflection of the conductive overlay at the position outside of the touch portion in response to a touch on the first overlay surface at the touch portion,
wherein the circuit board, the conductive overlay, and the protrusion are arranged such that:
the second overlay surface faces the circuit board surface,
the second overlay surface and the first conductive sensor pad are separated by a first distance such that the second thickness causes the protrusion surface and the first conductive sensor pad to be separated by a second distance, and
the protrusion surface and the first conductive sensor pad have an overlapping area.

15. The apparatus of claim 14, wherein the overlapping area is not centered over the first conductive sensor pad.

16. The apparatus of claim 14, wherein the overlapping area comprises less than an area of the first conductive sensor pad.

17. The apparatus of claim 14, wherein the spacer physically contacts the circuit board surface, and wherein the third thickness causes the spacer to separate the second overlay surface and the first conductive sensor pad by the first distance.

18. The apparatus of claim 14, wherein the spacer comprises a first spacer, the circuit board further having a second spacer on the circuit board surface, the second spacer physically contacting the first spacer and having a fourth thickness such that the first and the second spacers separate the second overlay surface and the first conductive sensor pad by the first distance.

19. An apparatus comprising:
a circuit board;
a first capacitor plate disposed on the circuit board;
a set of spacers disposed on the circuit board alongside the first capacitor plate; and
a conductive overlay disposed on the set of spacers, wherein the conductive overlay includes:
an exterior surface disposed away from the first capacitor plate;
a first interior surface disposed towards first capacitor plate, wherein:
the conductive overlay has a first thickness between the exterior surface and the first interior surface; and
the first interior surface is separated from the first capacitor plate by a first distance in an untouched configuration; and
a second interior surface disposed towards the first capacitor plate, wherein:
the conductive overlay has a second thickness between the exterior surface and the second interior surface that is greater than the first thickness;
the second interior surface is separated from the first capacitor plate by a second distance in the untouched configuration; and
the second distance is less than the first distance.

20. The apparatus of claim 19, wherein the conductive overlay further includes a third interior surface that extends from the first interior surface to the second interior surface in a direction substantially perpendicular to the first capacitor plate in the untouched configuration.

21. The apparatus of claim 20, wherein the first interior surface extends along a top surface of a first spacer of the set of spacers such that the first interior surface is substantially coplanar along the top surface of the first spacer and from the first spacer to the third interior surface in the untouched configuration.

22. The apparatus of claim 19, wherein the conductive overlay has a substantially uniform composition between the exterior surface and the first interior surface and between the exterior surface and the second interior surface.

* * * * *